(12) United States Patent
Mizuno

(10) Patent No.: US 8,349,544 B2
(45) Date of Patent: Jan. 8, 2013

(54) METHOD OF MANUFACTURING SEMICONDUCTOR DEVICE

(75) Inventor: Norikazu Mizuno, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 167 days.

(21) Appl. No.: 12/717,389

(22) Filed: Mar. 4, 2010

(65) Prior Publication Data

US 2010/0227276 A1   Sep. 9, 2010

(30) Foreign Application Priority Data

Mar. 9, 2009   (JP) .................................. 2009-055370

(51) Int. Cl.
*G03F 7/26* (2006.01)

(52) U.S. Cl. ...................................................... 430/315

(58) Field of Classification Search .................. 430/313, 430/315
See application file for complete search history.

(56) References Cited

U.S. PATENT DOCUMENTS

| | | | |
|---|---|---|---|
| 2004/0053472 A1* | 3/2004 | Kiryu et al. ................... | 438/287 |
| 2010/0189917 A1* | 7/2010 | Suzuki et al. ................. | 427/523 |
| 2010/0216307 A1* | 8/2010 | Niroomand et al. .......... | 438/689 |
| 2011/0081786 A1* | 4/2011 | Surthi .......................... | 438/787 |

* cited by examiner

*Primary Examiner* — Kathleen Duda
(74) *Attorney, Agent, or Firm* — Brundidge & Stanger, P.C.

(57) ABSTRACT

In a method of manufacturing a semiconductor device, a protection film can be formed using a double exposure technology to increase a developer resistance of the protection film without increasing the thickness of the protection film for realizing fine patterning. The method comprises forming a protection film on a first resist pattern formed on a substrate; and forming a second resist pattern on the protection film between parts of the first resist pattern. The protection film is formed in at least two layers by using different methods.

11 Claims, 9 Drawing Sheets

Fig. 11
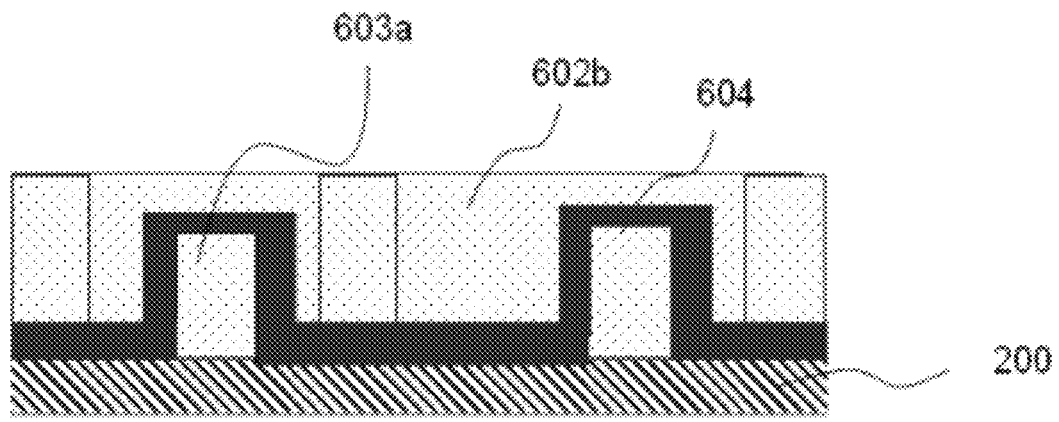
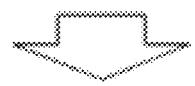
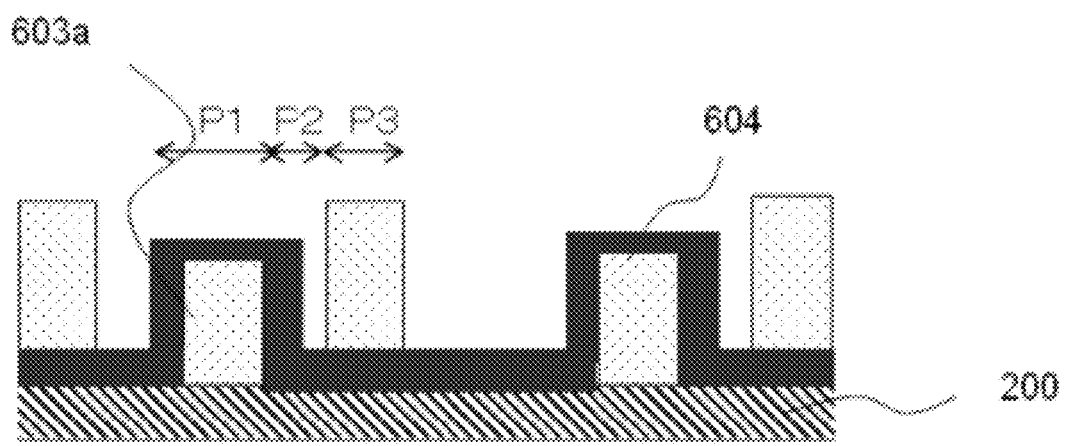

METHOD OF MANUFACTURING SEMICONDUCTOR DEVICE

CROSS-REFERENCE TO RELATED PATENT APPLICATION

This U.S. non-provisional patent application claims priority under 35 U.S.C. §119 of Japanese Patent Application No. 2009-055370, filed on Mar. 9, 2009, in the Japanese Patent Office, the entire contents of which are hereby incorporated by reference.

BACKGROUND OF THE INVENTION

1. Field of the Invention

The present invention relates to a method of manufacturing a semiconductor device, a semiconductor device, and a semiconductor device manufacturing apparatus, and for example, the present invention relates to a method of forming a pattern of a semiconductor device pattern using a double exposure method.

2. Description of the Prior Art

Memory devices such as a flash memory, a dynamic random access memory (DRAM), and a static random access memory (SRAM), and semiconductor devices such as a logic device are recently required to be highly integrated, and therefore miniaturization of patterns is essential. To integrate a lot of devices in a small area, the individual devices should be formed in small sizes, and therefore the pitch of a pattern which is the sum of a line width and spacing of the pattern should be made small. However, a photolithography process for forming a desired pattern is limited in resolution, and thus there is a limitation in forming a pattern having a fine pitch.

In recent years, technology (pattern forming technology) of forming a fine pattern on a substrate and processing an under layer of the pattern through an etching process using the pattern as a mask is widely applied in IC fabrication of semiconductor industries and is attracting a great attention. Therefore, as one of lithography techniques which have been newly proposed, a double patterning method for forming a photoresist pattern by performing a patterning two or more times is under investigation. According to this double patterning method, it is considered that a pattern can be formed more finely than a pattern formed by one-time patterning, and as an example of the double patterning method, technology of performing an exposure two or more times is under investigation.

FIG. 9 is schematic view illustrating formation of an insulation film as a protection film used in double exposure. A first resist solvent 602a is applied to a substrate (step A), and then the first resist solvent 602a is exposed (step B). Next, the first resist solvent 602a is developed (step C). If a photoresist is used as the resist, a part exposed to a developer is removed, and then a first resist pattern 603a is formed. In addition, a protection film 704 is formed on the first resist pattern 603a (unexposed) to protect the first resist pattern 603a (step D). In general, a resin based resist material changes in properties if it is heated to a high temperature, and thus it is difficult to form a pattern precisely. Therefore, it is preferable that the protection film 704 be formed at a low temperature to prevent deformation of the first resist pattern 603a, for example, in the range from 20° C. to 120° C. If possible, a thin film having a smaller thickness is preferable. For example, a film thickness of 50 Å or smaller is preferable.

Next, a second resist solvent 602b is applied (step E), and the second resist solvent 602b is exposed (step F). Since the protection film 704 is transparent, both the first resist pattern 603a and the second resist solvent 602b are exposed in step F.

An exposed part is removed using a developer to form a second resist pattern 603b (step G). Here, although the second resist solvent 602b can be easily removed, the first resist pattern 603a is not removed because the first resist pattern 603a is protected by the protection film 704.

If a mask gap, that is, the gap between lines, is defined as P0, a mask having a relationship of P1=P2=P3=P0/4 can be formed. Therefore, a process surface (not shown) under the resist can be finely patterned.

However, as shown in FIG. 10, since the protection film 704 is thin, a problem can occur in the developing process of step G: that is, a developer can pass through the protection film 704 to remove the first resist pattern 603a as well as the second resist pattern 603b. As a measure for this, a method of increasing the thickness of the protection film 704 is usually selected; however, as shown in FIG. 11, although the first resist pattern 603a is not removed in step G if the thickness of the 704 is increased, pattern dimensions cannot be precisely controlled and can be P2<P1 or P2<P3, thereby making it difficult to form fine patterns evenly.

SUMMARY OF THE INVENTION

An object of the present invention is to provide a method of manufacturing a semiconductor device, in which a protection film can be formed using a double exposure technology to increase a developer resistance of the protection film without increasing the thickness of the protection film for realizing fine patterning.

According to an aspect of the present invention, there is provided a method of manufacturing a semiconductor device, the method including: (a) forming a first resist pattern on a substrate; (b) forming a protection film including a first protection film and a second protection film for protecting the first resist pattern by forming the first protection film covering the first resist pattern using a first method, and forming the second protection film on the first protection film using a second method different from the first method; and (c) forming a second resist pattern on a portion of the second protection film between first resist pattern.

BRIEF DESCRIPTION OF THE DRAWINGS

FIG. 11 is a view for explaining another problem of a protection film used in a conventional double exposure method.

DETAILED DESCRIPTION OF THE PREFERRED EMBODIMENTS

Figure 1:
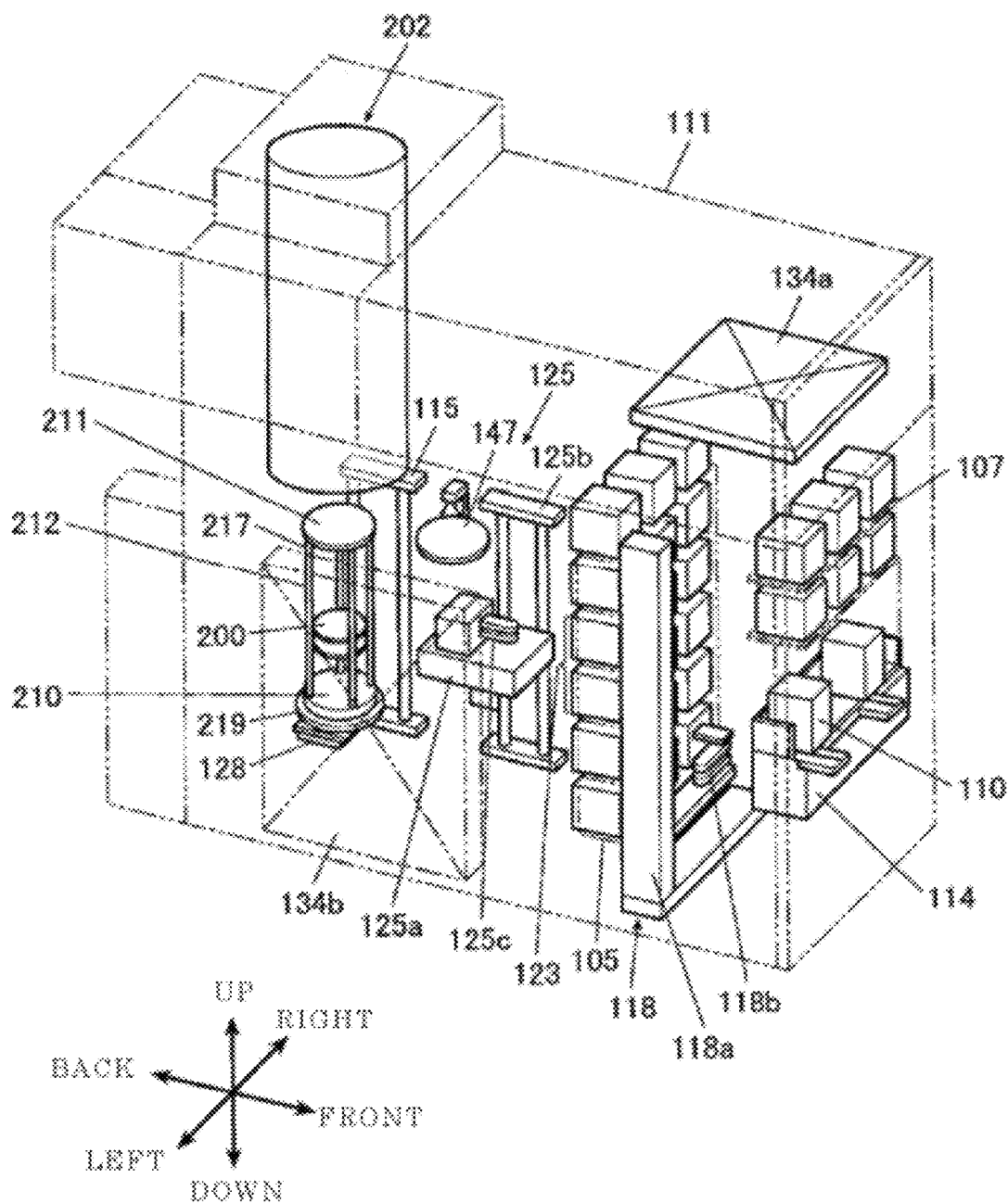
FIG. 1 is a perspective view schematically illustrating a substrate processing apparatus according to a preferred embodiment of the present invention.

Since resist has a low thermal resistance and is easily deformed at a temperature of 150° C., the above-described protection film (insulating film) is generally formed at a low temperature to prevent damage to the resist.

Although low-temperature film forming can be easily carried out by using plasma energy, if oxidation is performed using plasma (for example, $O_2$ plasma oxidation), a resist can be burned (ashed) by plasma, and thus it is not preferable to perform plasma film forming on the resist.

Alternatively, low-temperature film forming is possible by using a catalyst. For example, a source such as hexachlorodisilane (HCD, $Si_2Cl_6$), $H_2O$, and pyridine ($C_5H_5N$) can be used to form a silicon oxide ($SiO_2$) thin film (for example, having a thickness of 20 Å or smaller) on a resist without deformation of the resist. However, since such a film formed using a catalyst has a high moisture concentration, a developer can easily pass through the film if the film is thin, and thus the above-described problems occur.

Thus, a developer is considered. A developer contains strong alkaline tetramethylammonium hydroxide (TMAH) as a main component and is very easily dissolved in water. Therefore, if a protection film contains moisture, a developer is dissolved in the moisture and reaches a lower first resist pattern. That is, if a protection film contains moisture, the protection becomes less resistant to a developer.

To maintain the developer-resistance of a thin film, it is necessary to reduce moisture contained in the thin film, and thus it is preferable that a protection film be formed without using water. For example, it is effective that $O_2$ plasma is used as an oxidation species. Although it has been explained that $O_2$ plasma could damage a resist, if a film exists on the surface of a resist to prevent damage to the resist, use of $O_2$ plasma is not limited because the film functions as a protection film against plasma.

According to the present invention proposed based on the knowledge of the inventors, a first protection film is formed on the surface of a resist in a manner such that the resist is not damaged, and a first protection film which is highly resistant to a developer is formed on the first protection film. In this way, by forming a protection film in two steps, uniform fine patterning can be realized while protecting a first resist pattern from heat, a developer, and plasma.

Hereinafter, an explanation will be given below on preferred embodiments of the present invention with reference to drawings.

A substrate processing apparatus relevant to the present embodiment is configured as an example of a semiconductor manufacturing apparatus used in fabrication of a semiconductor device (IC).

In the following explanation, as an example of the substrate processing apparatus, an explanation will be given on the case of using a vertical type apparatus which performs a film forming process or the like on a substrate. However, the present invention is not premised on the use of the vertical type apparatus, and may be applied to the use of a single wafer type apparatus, for example.

As shown in FIG. 1, in a substrate processing apparatus 101, cassettes 110 configured to accommodating substrates such as wafers 200 are used, and the wafers 200 are made of a material such as silicon. The substrate processing apparatus 101 includes a case 111, and a cassette stage 114 is installed at the inside of the case 111. The cassettes 110 are configured to be carried in on the cassette stage 114, or carried out from the cassette stage 114, by an in-process carrying unit (not shown).

On the cassette stage 114, a cassette 110 is placed by an in-process carrying device in a manner such that wafers 200 are vertically positioned in the cassette 110 and a wafer taking in/out entrance of the cassette 110 is pointed upward. The cassette stage 114 is configured so that the cassette 110 is rotated 90° counterclockwise in a longitudinal direction to the backward of the case 111 so as to horizontally orient the wafers 200 of the cassette 110 and point the wafer taking in/out entrance of the cassette 110 to the backward of the case 111.

Near the center part of the case 111 in a front-to-back direction, a cassette shelf 105 is installed. The cassette shelf 105 is configured so that a plurality of cassettes 110 can be stored in multiple rows and columns.

At the cassette shelf 105, a transfer shelf 123 is installed to store cassettes 110, which are carrying objects of a wafer transfer mechanism 125.

At the upside of the cassette stage 114, a standby cassette shelf 107 is installed, and configured to store standby cassettes 110.

Between the cassette stage 114 and the cassette shelf 105, a cassette carrying device 118 is installed. The cassette carrying device 118 includes a cassette elevator 118a capable of moving upward and downward while holding a cassette 110, and a cassette carrying mechanism 118b as a carrying mechanism. The cassette carrying device 118 is configured to carry cassettes 110 among the cassette stage 114, the cassette shelf 105, and the standby cassette shelf 107 by continuous motions of the cassette elevator 118a and the cassette carrying mechanism 118b.

At the backside of the cassette shelf 105, the wafer transfer mechanism 125 is installed. The wafer transfer mechanism 125 includes a wafer transfer device 125a capable of rotating or linearly moving wafers 200 in a horizontal direction, and a wafer transfer device elevator 125b configured to move the wafer transfer device 125a upward and downward. At the wafer transfer device 125a, tweezers 125c are installed to pick up wafers 200. The wafer transfer mechanism 125 is configured to pick up wafers 200 using the tweezers 125c, and charge the wafers 200 into a boat 217 or discharge the wafer 200 from the boat 217, by continuous motions of the wafer transfer device 125a and the wafer transfer device elevator 125b.

At the upside of the rear part of the case 111, a process furnace 202 is installed to perform a heat treatment process on wafers 200, and the bottom side of the process furnace 202 is configured to be opened and closed by a furnace port shutter 147.

At the downside of the process furnace 202, a boat elevator 115 is installed to move the boat 217 upward to and downward from the process furnace 202. An arm 128 is connected to an elevating table of the boat elevator 115, and a seal cap 219 is horizontally attached to the arm 128. The seal cap 219 supports the boat 217 vertically, and is configured be seal the bottom side of the process furnace 202.

The boat 217 includes a plurality of holding members, and is configured to hold a plurality of wafers 200 (for example, about fifty to one hundred fifty wafers) horizontally in a state that the wafers 200 are vertically arranged with the centers of the wafers 200 being aligned.

At the upside of the cassette shelf 105, a cleaning system 134a is installed to supply clean air as purified atmosphere. The cleaning system 134a includes a supply fan and a dust filter to supply clean air to the inside of the case 111.

At the left side end part of the case 111, another cleaning system 134b is installed to supply clean air. The cleaning system 134b includes a supply fan and a dust filter to supply clean air to the surrounding area of the wafer transfer device 125a, the boat 217, or the like. After flowing around the wafer transfer device 125a, the boat 217 or the like, clean air is exhausted to the outside of the case 111.

Next, a main operation of the substrate processing apparatus 101 will be described.

A cassette 110 carried to the cassette stage 114 by the in-process carrying unit (not shown) is placed on the cassette stage 114 in a state where wafers 200 inside the cassette 110 are vertically positioned and the wafer taking in/out entrance of the cassette 110 is pointed upward. Thereafter, the cassette 110 is rotated counterclockwise by 90° in a longitudinal direction toward the backward of the case 111 by the cassette stage 114 so that the wafers 200 inside the cassette 110 are horizontally positioned and the wafer taking in/out entrance of the cassette 110 is pointed to the backward of the case 111.

Then, the cassette 110 is automatically carried and placed by the cassette carrying device 118 to a specified shelf position of the cassette shelf 105 or the standby cassette shelf 107 so as to be temporarily stored, and is then transferred to the transfer shelf 123 from the cassette shelf 105 or the standby cassette shelf 107 by the cassette carrying device 118. Alternatively, the carry cassette 110 may be directly transferred to the transfer shelf 123 from the cassette stage 114.

After the cassette 110 is transferred to the transfer shelf 123, wafers 200 are picked up from the cassette 110 through the wafer taking in/out entrance of the cassette 110 and are charged into the boat 217 by the tweezers 125c of the wafer transfer device 125a. After delivering the wafer 200 to the boat 217, the wafer transfer device 125a returns to the cassette 110 so as to charge the next wafers 200 into the boat 217.

After a predetermined number of wafers 200 are charged into the boat 217, the bottom side of the process furnace 202 closed by the furnace port shutter 147 is opened by moving the furnace port shutter 147. Subsequently, the boat 217 holding the group of wafers 200 is loaded into the process furnace 202 by an ascending motion of the boat elevator 115, and the bottom side of the process furnace 202 is closed by the seal cap 219.

After the loading, a predetermined heat treatment process is performed on the wafers 200 charged in the process furnace 202. Thereafter, the wafers 200 and the cassette 110 are carried to the outside of the case 111 in a reverse sequence of the above.

Figure 2:
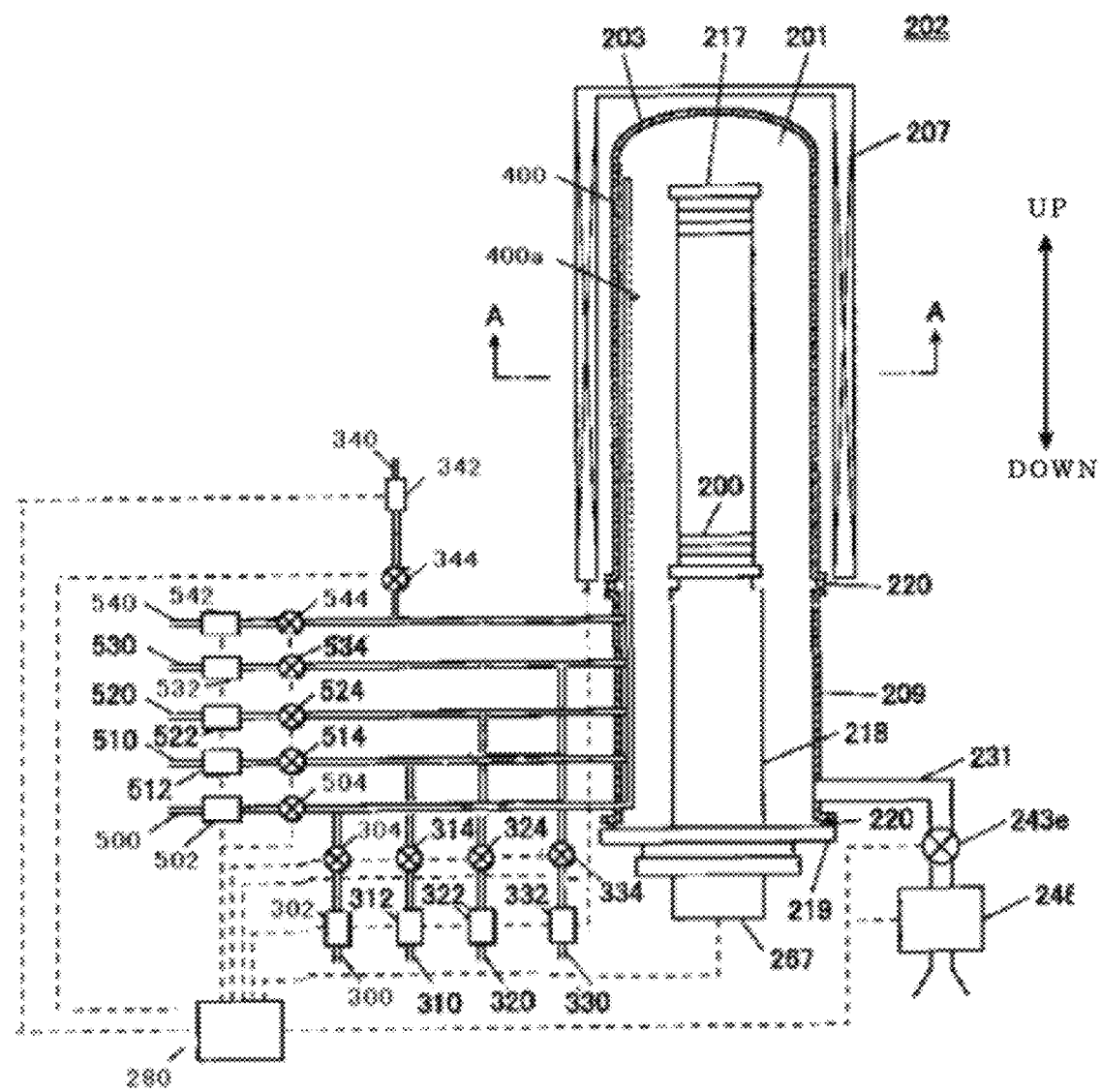
FIG. 2 is a schematic view illustrating a vertical type processing furnace and accompanying members that are used according to the preferred embodiment of the present invention, in which particularly a longitudinal cross-sectional view of the processing furnace part is shown.
Figure 3:
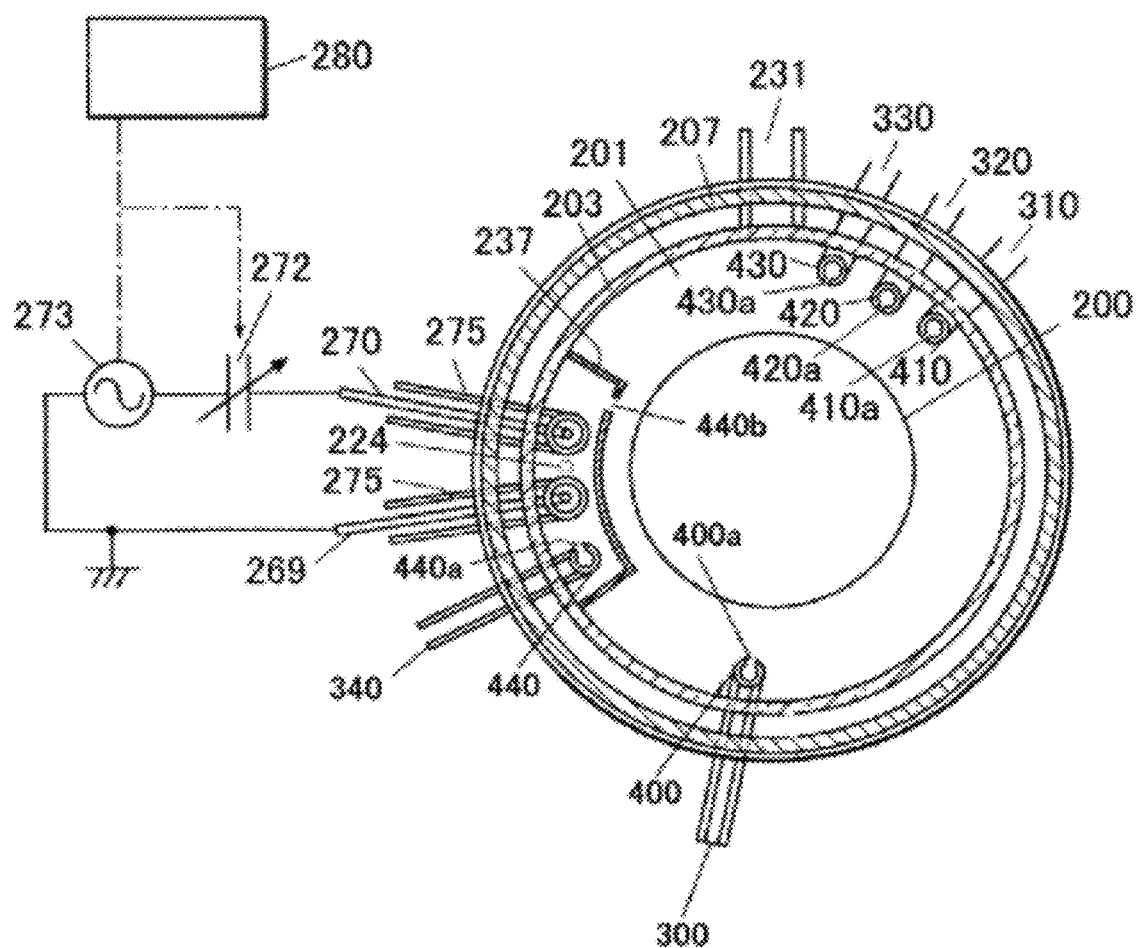
FIG. 3 is a sectional view taken along the A-A line of FIG. 2.

As shown in FIG. 2 and FIG. 3, at the process furnace 202, a heater 207 is installed to heat wafers 200. The heater 207 includes an insulating member having a cylindrical shape with a closed top side, and a plurality of heating wires installed with respect to the insulating member to form a heating unit structure. Inside the heater 207, a reaction tube 203 is installed to process wafers 200.

At the lower end of the reaction tube 203, a manifold 209 made of a material such as stainless steel is installed in a manner such that an O-ring 220 is disposed therebetween as a sealing member. A lower end opening of the manifold 209 is tightly sealed by a cap such as the seal cap 219 with an O-ring 220 being disposed between the manifold 209 and the seal cap 219. The seal cap 219 is made of a metal such as stainless steel and has a disk shape. In the process furnace 202, a processing chamber 201 is formed at least by the reaction tube 203, the manifold 209, and the seal cap 219.

At the seal cap 219, a boat support 218 is installed to support the boat 217. The boat support 218 is made of a heat-resistant material such as quartz or silicon carbide. As shown in FIG. 1, the boat 217 includes a bottom plate 210 fixed to the boat support 218, a top plate 211 disposed at the top side of the boat 217, and a plurality of pillars 212 installed between the bottom plate 210 and the top plate 211. In the boat 217, a plurality of wafers 200 are held. The plurality of wafers 200 are supported by the pillars 212 of the boat 217 in a state where the wafers 200 are arranged at regular intervals and horizontally oriented.

At the above-described process furnace 202, in a state where a plurality of wafers 200 to be batch-processed are piled in multiple states inside the boat 217, the boat 217 is inserted into the processing chamber 201 while being supported by the boat support 218, and then the heater 207 heats the wafers 200 inserted in the processing chamber 201 to a predetermined temperature.

As shown in FIG. 2 and FIG. 3, four source gas supply pipes 300, 310, 320, and 340 configured to supply source gases, and a catalyst supply pipe 330 configured to supply a catalyst are connected to the processing chamber 201.

At the source gas supply pipe 300, a mass flow controller 302 and a valve 304 are installed. A nozzle 400 is connected to the leading end of the source gas supply pipe 300. The nozzle 400 extends upward in an arc-shaped space between the reaction tube 203 constituting the processing chamber 201 and the wafers 200 along the inner wall of the reaction tube 203. A plurality of gas supply holes 400a are formed in the lateral side of the nozzle 400 to supply a source gas through the gas supply holes 400a. The sizes of the gas supply holes 400a are equal or varied from the lower side to the upper side, and the gas supply holes 400a are arranged at the same pitch.

In addition, a carrier gas supply pipe 500 is connected to the source gas supply pipe 300 to supply a carrier gas. At the carrier gas supply pipe 500, a mass flow controller 502 and a valve 504 are installed.

At the source gas supply pipe 310, a mass flow controller 312 and a valve 314 are installed. A nozzle 410 is connected to the leading end of the source gas supply pipe 310. The nozzle 410 extends upward in an arc-shaped space between the reaction tube 203 constituting the processing chamber 201 and the wafers 200 along the inner wall of the reaction tube 203. A plurality of gas supply holes 410a are formed in the lateral side of the nozzle 410 to supply a source gas through the gas supply holes 410a. The sizes of the gas supply holes 410a are equal or varied from the lower side to the upper side, and the gas supply holes 410a are arranged at the same pitch.

In addition, a carrier gas supply pipe 510 is connected to the source gas supply pipe 310 to supply a carrier gas. At the carrier gas supply pipe 510, a mass flow controller 512 and a valve 514 are installed.

At the source gas supply pipe 320, a mass flow controller 322 and a valve 324 are installed. A nozzle 420 is connected to the leading end of the source gas supply pipe 320. Like the nozzle 410, the nozzle 420 extends upward in an arc-shaped space between the reaction tube 203 constituting the processing chamber 201 and the wafers 200 along the inner wall of the reaction tube 203. A plurality of gas supply holes 420a are formed in the lateral side of the nozzle 420 to supply a source gas through the gas supply holes 420a. Like the gas supply holes 410a, the sizes of the gas supply holes 420a are equal or varied from the lower side to the upper side, and the gas supply holes 420a are arranged at the same pitch.

In addition, a carrier gas supply pipe 520 is connected to the source gas supply pipe 320 to supply a carrier gas. At the carrier gas supply pipe 520, a mass flow controller 522 and a valve 524 are installed.

At the catalyst supply pipe 330, a mass flow controller 332 and a valve 334 are installed. A nozzle 430 is connected to the leading end of the catalyst supply pipe 330. Like the nozzle 410, the nozzle 430 extends upward in an arc-shaped space between the reaction tube 203 constituting the processing chamber 201 and the wafers 200 along the inner wall of the reaction tube 203. A plurality of catalyst supply holes 430a are formed in the lateral side of the nozzle 430 to supply a catalyst through the catalyst supply holes 430a. Like the gas supply holes 410a, the sizes of the catalyst supply holes 430a are equal or varied from the lower side to the upper side, and the catalyst supply holes 430a are arranged at the same pitch.

In addition, a carrier gas supply pipe 530 is connected to the catalyst supply pipe 330 to supply a carrier gas. At the carrier gas supply pipe 530, a mass flow controller 532 and a valve 534 are installed.

At the source gas supply pipe 340, a mass flow controller 342 and a valve 344 are installed. A nozzle 440 is connected to the leading end of the source gas supply pipe 340. In addition, a carrier gas supply pipe 540 is connected to the source gas supply pipe 340 to supply a carrier gas. At the carrier gas supply pipe 540, a mass flow controller 542 and a valve 544 are installed.

In the arc-shaped space between the inner wall of the reaction tube 203 constituting the processing chamber 201 and the wafers 200, a buffer chamber 237 is installed as a gas diffusion space in a manner such that the buffer chamber 237 extends from a lower part to an upper part of the inner wall of the reaction tube 203 along the piled direction of the wafers 200, and gas supply holes 440b are formed in an end part of a wall of the buffer chamber 237 adjacent to the wafers 200. The gas supply holes 44bb are opened toward the centerline of the reaction tube 203. The gas supply holes 44b have the same open area and are formed at the same pitch from the lower side to the upper side.

At an end part of the buffer chamber 237 opposite to the gas supply holes 440b, the nozzle 440 extends from the lower part to the upper part of the reaction tube 203 along the piled direction of the wafers 200. A plurality of gas supply holes 440a are formed in the nozzle 440. If the pressure difference between the buffer chamber 237 and the processing chamber 201 is small, the gas supply holes 440a may have the same open area and be formed at the same pitch from the upstream side to the downstream side. However, if the pressure difference is large, the open areas of the gas supply holes 440a may increase from the upstream side to the downstream side, or the pitch of the gas supply holes 440a may decrease from the upstream side to the downstream side.

In the current embodiment, the open areas of the gas supply holes 440a increase gradually from the upstream side to the downstream side. Owing to this configuration, gas can be ejected into the buffer chamber 237 through the gas supply holes 440a with approximately the same flow rate along the gas supply holes 440a although the velocity of the gas may be varied along the gas supply holes 440a.

After the particle velocity variation of gas ejected through the gas supply holes 440a is reduced in the buffer chamber 237, and then the gas is ejected into the processing chamber 201 through the gas supply holes 440b. Therefore, when gas supplied through the gas supply holes 440a is ejected through the gas supply holes 440b, the gas can have a uniform flow rate and velocity.

In addition, at the buffer chamber 237, first and second rod-shaped electrodes 269 and 270 which are first and second electrodes having a slender and long shape are installed in a state where the first and second rod-shaped electrodes 269 and 270 extend from the lower side to the upper side and are protected with electrode protection tubes 275. One of the first and second electrodes 269 and 270 is connected to a high-frequency power source 273 through a matching device 272, and the other is earthed to a reference potential. As a result, plasma can be generated in a plasma generation region 224 between the first and second electrodes 269 and 270.

The electrode protection tubes 275 are configured so that the first and second rod-shaped electrodes 269 and 270 can be respectively inserted into the buffer chamber 237 in a state where the first and second rod-shaped electrodes 269 and 270 are isolated from the atmosphere of the buffer chamber 237. If the atmosphere inside the electrode protection tubes 275 is the same as outside air (atmosphere), the first and second rod-shaped electrodes 269 and 270 inserted respectively in the electrode protection tubes 275 are oxidized when heated by the heater 207. For this reason, an inert gas purge mechanism is installed to fill or purge the inside areas of the electrode protection tubes 275 with inert gas such as nitrogen so as to maintain the oxygen concentration inside the electrode protection tubes 275 at a sufficiently low level for preventing oxidation of the first and second rod-shaped electrodes 269 and 270.

In the above-described structure, as an example of a source gas, a Si source such as trisdimethylaminosilane (TDMAS: $SiH(N(CH_3)_2)_3$), bis tertiary butyl amino silane (BTBAS), bis(diethylamino)silane (BDEAS), and bis(ethylmethylamino)silane (BDEMAS) is introduced into the source gas supply pipe 300. As an example of a source gas, a Si source such as trisdimethylaminosilane (TDMAS: $SiH(N(CH_3)_2)_3$), dichlorosilane (DCS: $SiH_2Cl_2$), hexachlorosilane (HCD: $Si_2Cl_6$), and tetrachlorosilane ($SiCl_4$) is introduced into the source gas supply pipe 310.

As an example of an oxidizing gas, a gas such as $H_2O$ or $H_2O_2$ is introduced into the source gas supply pipe 320. As an example of a catalyst, a substance such as pyridine ($C_5H_5N$), pyrimidine, quinoline, aminopyridine, picoline, piperazine, and lutidine is introduced into the catalyst supply pipe 330. As an example of a source gas, a gas such as $O_2$, ($O_2+H_2$), $N_2O$, and NO is introduced into the source gas supply pipe 340.

An exhaust pipe 231 is connected to the processing chamber 201 through a valve 243e so as to exhaust the inside atmosphere of the processing chamber 201. A vacuum pump 246 is connected to the exhaust pipe 231 so that the inside of the processing chamber 201 can be vacuum-evacuated by operating the vacuum pump 246. The valve 243e is an on-off valve which can be opened or closed to start or stop vacuum-evacuation of the processing chamber 201, and in addition, by adjusting the degree of opening of the valve 243e, the inside pressure of the processing chamber 201 can be controlled.

At the center part of the reaction tube 203, the boat 217 is installed. The boat 217 can be moved upward into and downward from (enter and exit) the reaction tube 203 by the boat elevator 115. At the lower end portion of the boat support 218 supporting the boat 217, a boat rotating mechanism 267 for rotating the boat 217 is installed so as to improve processing uniformity. By operating the boat rotating mechanism 267, the boat 217 supported by the boat support 218 can be rotated.

A controller 280 is connected to members such as the mass flow controllers 302, 312, 322, 332, 342, 502, 512, 522, 532, and 542, the valves 304, 314, 324, 334, 344, 504, 514, 524, 534 and 544, the valve 243e, the heater 207, the vacuum pump 246, the boat rotating mechanism 267, and the boat elevator 115. The controller 280 is an example of a control unit that controls the overall operation of the substrate processing apparatus 101, and the controller 280 is configured to control operations such as flow rate adjusting operations of the mass flow controllers 302, 312, 322, 332, 342, 502, 512, 522, 532, and 542; opening and closing operations of the valves 304, 314, 324, 334, 344, 504, 514, 524, 534 and 544; opening, closing, and pressure adjusting operations of the valve 243e; a temperature adjusting operation of the heater 207; start and stop operations of the vacuum pump 246; a rotation speed adjusting operation of the boat rotating mechanism 267; an elevating operation of the boat elevator 115.

Next, as an example of a manufacturing method of a semiconductor device, an application of the present invention to fabrication of a large scale integration (LSI) circuit is explained.

LSI circuits are manufactured through an assembly process, a test process, and a reliability test process after a silicon wafer is processed by a wafer process. The wafer process is divided into a substrate process for performing oxidation, diffusion, or the like on the silicon wafer, and an interconnection process for forming interconnections on the surface of the silicon wafer. Cleaning, thermal treatment, and film formation are repeated, based on a lithography process. In the lithography process, a resist pattern is formed, and etching is performed using the pattern as a mask so as to process an under layer of the pattern.

Hereinafter, with reference to FIG. 4, an explanation will be given on an example of a process sequence for forming a resist pattern on a wafer 200. The same processes as the above-described conventional processes are denoted by the same reference numerals and step numbers.

According to the process sequence, the follow processes are sequentially performed: a first resist pattern forming process for forming a first resist pattern 603a on a wafer 200; a first protection film forming process for forming a thin film on the first resist pattern 603a as a first protection film for protecting the first resist pattern 603a; a second protection film forming process for forming a second protection film highly resistant to a developer on the thin film; and a second resist pattern forming process for forming a second resist pattern 603b on the second protection film. Hereinafter, the respective processes will be described.

<First Resist Pattern Forming Process>

In the first resist pattern forming process, the first resist pattern 603a is formed on the wafer 200 or a hard mask (not shown) formed on the wafer 200.

Figure 4:
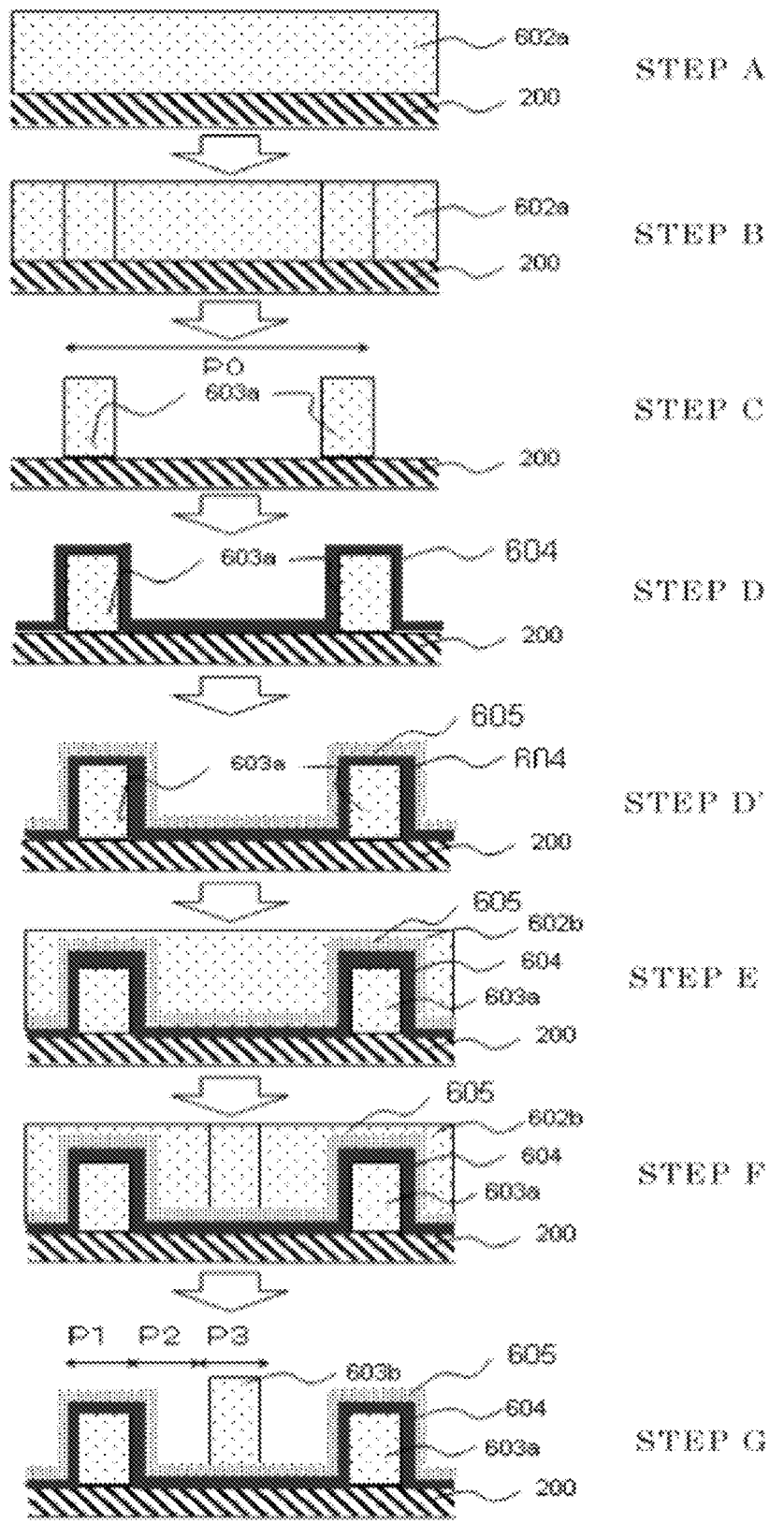
FIG. 4 is a schematic view illustrating formation of a photoresist pattern on a wafer used as a substrate, in a preferred embodiment of the present invention.

At first, a first resist solvent 602a is applied to the wafer 200 or the hard mask (not shown) formed on the wafer 200 (step A in FIG. 4). Thereafter, the first resist pattern 603a is formed by baking, and selective exposure and development using a mask pattern and a light source such as an ArF excimer light source (193 nm) or a KrF excimer light source (248 nm) (step B and step C in FIG. 4).

<First Protection Film Forming Process>

In the first protection film forming process, the thin film is formed as a protection material on the first resist pattern 603a, which is formed in the first resist pattern forming process, and a region where the first resist pattern 603a is not formed (step D in FIG. 4). Owing to this, thermal deformation or quality change of the first resist pattern 603a can be prevented, and the first resist pattern 603a will not be ashed by plasma used for forming a second protection film in a later process. In the following description, an explanation will be given on an exemplary process of forming a first $SiO_2$ film as a first protection film at an extremely low temperature by an atomic layer deposition (ALD) method using the substrate processing apparatus 101.

The ALD method is a kind of a chemical vapor deposition (CVD), in which source gases containing at least two kinds of sources are alternately supplied to a substrate under predetermined film forming conditions (temperature, time, and the like) so that the substrate adsorbs the source gases in units of a single atom and a film is formed by surface reaction. In this case, the control of film thickness is performed by controlling the number of cycles of supplying the source gases (for example, assuming that a film forming speed is 1 Å/cycle, 20 cycles are executed in the case of forming a film of 20 Å).

Figure 5:
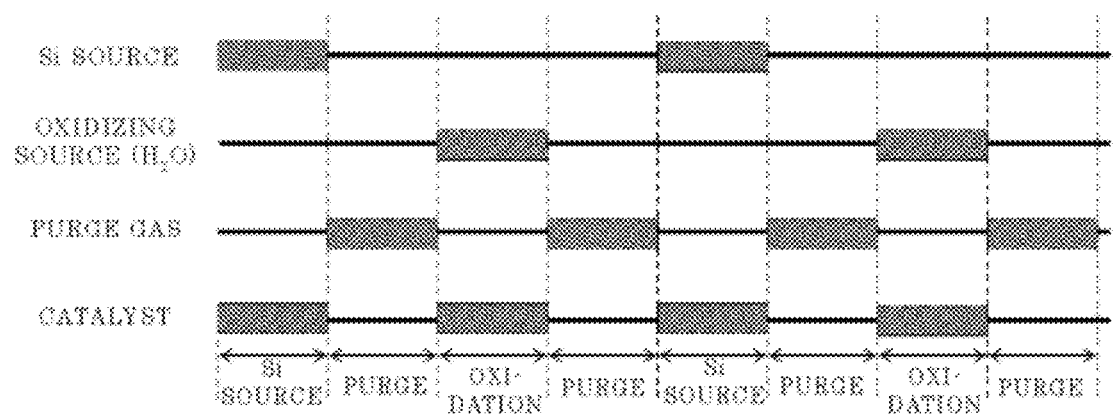
FIG. 5 is a schematic view illustrating a main gas supply sequence in the case where a $SiO_2$ film 604 is formed by an atomic layer deposition (ALD) method, in a preferred embodiment of the present invention.

FIG. 5 illustrates a schematic main gas supply sequence in the current embodiment.

In the current embodiment, HCD is used as a Si source gas, $H_2O$ is used as an oxidizing source, pyridine is used as a catalyst, and $N_2$ is used as a carrier gas, and this case will be explained with reference to FIG. 1, FIG. 2, and FIG. 5.

In the film forming process, the controller 280 controls the substrate processing apparatus 101 as follows. That is, by controlling the heater 207, the inside of the processing chamber 201 is maintained at a temperature lower than a deformation temperature of a resist film, for example, in the range from room temperature to 150° C., preferably 100° C. Thereafter, a plurality of wafers 200 are charged into the boat 217, and the boat 217 is loaded into the processing chamber 201. Thereafter, the boat 217 is rotated by the boat rotating mechanism 267, so that the wafers 200 are rotated. Then, the vacuum pump 246 is operated and, at the same time, the valve 243e is opened so as to vacuum-evacuate the inside of the processing chamber 201, and if the temperature of the wafers 200 reaches 100° C. and is stably kept at 100° C., the following four steps are executed sequentially in a state that the temperature inside the processing chamber 201 is maintained at 100° C.

(Step 11)

While introducing (flowing) HCD into the source gas supply pipe 310, $H_2O$ into the source gas supply pipe 320, a catalyst into the catalyst supply pipe 330, and $N_2$ into the carrier gas supply pipes 510, 520 and 530, the valves 314, 334, 514, 524 and 534 are opened appropriately. However, the valves 304, 324, and 344 are in a closed state.

As a result, as shown in FIG. 5, the HCD, while mixing with $N_2$, flows out through the source gas supply pipe 310 to the nozzle 410, and is supplied from the gas supply holes 410a into the processing chamber 201. In addition, the catalyst, while mixing with $N_2$, flows out through the catalyst supply pipe 330 to the nozzle 430, and is supplied from the catalyst supply holes 430a into the processing chamber 201. $N_2$ flows out through the carrier gas supply pipe 520 to the nozzle 420, and is supplied from the gas supply holes 420a into the processing chamber 201. The HCD and the catalyst supplied into the processing chamber 201 pass over the surface of the wafer 200 and are exhausted through the exhaust pipe 231.

In step 11, by controlling the valves 314 and 334, the supply time of the HCD and the catalyst is set to 1 second to 100 seconds, preferably, 5 seconds to 30 seconds. In addition, the valves 314 and 334 are controlled so that the supply amount ratio of HCD (sccm)/catalyst (sccm) is kept in the range from 0.01 t 100, preferably, in the range from 0.05 to 10. At the same time, by controlling the valve 243e properly, the inside pressure of the processing chamber 201 is kept at an optimal value (for example, 10 Ton) within a predetermined range. In step 11, by supplying the HCD and the catalyst into the processing chamber 201, Si or intermediate Si is adsorbed on the first resist pattern 603a formed on the wafer 200, and on the wafer 200 or the hard mask (not shown) formed on the wafer 200.

(Step 12)

By closing the valves 314 and 334, the supply of the HCD and the catalyst is stopped. At the same time, as shown in FIG. 5, by continuously supplying $N_2$ from the carrier gas supply pipes 510, 520 and 530 into the processing chamber 201, the inside of the processing chamber 201 is purged with $N_2$. The purge time is, for example, 15 seconds. At this time, two processes (purging and vacuum-evacuation processes) may be performed within 15 seconds. As a result, the HCD and the catalyst remaining in the processing chamber 201 are discharged from the processing chamber 201.

(Step 13)

In a state that the valves 514, 524 and 534 are opened, the valves 324 and 334 are opened appropriately. The valve 304, 314, and 344 are in a closed state. As a result, as shown in FIG. 5, $H_2O$, while mixing with $N_2$, flows out through the source gas supply pipe 320 to the nozzle 420, and is supplied from the gas supply holes 420a into the processing chamber 201. In addition, the catalyst, while mixing with $N_2$, flows out through the catalyst supply pipe 330 to the nozzle 430, and is supplied from the catalyst supply holes 430a to the processing chamber 201. Furthermore, $N_2$ flows out through the carrier gas supply pipe 510 to the nozzle 410, and is supplied from the gas supply holes 410a to the processing chamber 201. The $H_2O$ and the catalyst supplied into the processing chamber 201 pass over the surface of the wafer 200 and are exhausted through the exhaust pipe 231.

In step 13, by controlling the valves 324 and 334, the supply time of the $H_2O$ and the catalyst are adjusted in the range from 1 second to 100 seconds, preferably, in the range from 5 second to 30 seconds. The valves 314 and 334 are controlled so that the supply amount ratio of $H_2O$ (sccm)/catalyst (sccm) is adjusted in the range from 0.01 to 100, preferably, in the range from 0.05 to 10. At the same time, by controlling the valve 243e properly, the inside pressure of the processing chamber 201 is set to an optimal value (for example, 10 Ton) within a predetermined range. In step 13, by supplying the $H_2O$ and the catalyst into the processing chamber 201, a $SiO_2$ film is formed on the first resist pattern 603a formed on the wafer 200, and on the wafer 200 or the hard mask (not shown) formed on the wafer 200. In addition, preferably, the $H_2O$ and the catalyst may be supplied at the same concentration.

In addition, a necessary property for the oxidizing source (corresponding to $H_2O$) supplied in step 13 is that molecules of the oxidizing source contain atoms having high electronegativity and thus the oxidizing source has electric polarity. The reason for this is that since the electronegativity of the catalyst is high, the catalyst lowers the activation energy of the source gas and accelerates reaction. Therefore, as the source gas supplied in the above step 13, $H_2O$ or $H_2O_2$ having OH-bonds is suitable, whereas a nonpolar molecule such as $O_2$ or $O_3$ is not suitable.

(Step 14)

By closing the valves 324 and 334, the supply of $H_2O$ and the catalyst is stopped. At the same time, as shown in FIG. 5, by continuously supplying $N_2$ from the carrier gas supply pipes 510, 520 and 530 into the processing chamber 201, the inside of the processing chamber 201 is purged with $N_2$. The purge time is, for example, 15 seconds. At this time, two processes (purging and vacuum-evacuation processes) may be performed within 15 seconds. As a result, the $H_2O$ and the catalyst remaining inside the processing chamber 201 are discharged from the processing chamber 201.

Thereafter, steps 11 to 14 are set as one cycle, and this cycle is repeated a plurality of times to form a $SiO_2$ film having a predetermined thickness on the first resist pattern 603a formed on the wafer 200, and on the wafer 200 or the hard mask (not shown) formed on the wafer 200. In this case, in each of the cycles, as explained above, it should be noted that the atmosphere formed by the Si source and the catalyst in step 11 should not be mixed with the atmosphere formed by the oxidizing source and the catalyst in step 13. In this way, as a first protection film, a first $SiO_2$ film 604 is formed on the first resist pattern 603a formed on the wafer 200, and on the wafer 200 or the hard mask (not shown) formed on the wafer 200 (step D in FIG. 4).

Thereafter, the HCD, $H_2O$ and catalyst remaining in the processing chamber 201 are exhausted by vacuum-exhausting the inside of the processing chamber 201, and the inside of the processing chamber 201 is set to atmospheric pressure by controlling the valve 243e, and the boat 217 is unloaded from the processing chamber 201. In this way, a film forming process (batch process) is finished once.

Thickness of the $SiO_2$ film 604 which is a first protection film is required to be about 5% of a half pitch (Hp) which is a limit resolution of lithography. Therefore, for example, if Hp is 30 nm, the thickness of the $SiO_2$ film 604 may be 5 Å to 25 Å, preferably, 15 Å. In addition, the thickness of the $SiO_2$ film 604 may be 10 Å or greater so as to sufficiently protect the first resist pattern 603a when a second $SiO_2$ film 605 is formed in a later process.

<Second Protection Film Forming Process>

In the second protection film forming process, as shown in step D' in FIG. 4, on the first $SiO_2$ film 604 which is formed in the first protection film forming process as a first protection film, a second $SiO_2$ film 605 being a protection material is formed as a second protection film highly resistant to a developer (that is, containing a less moisture concentration). In the following description, an explanation will be given on an exemplary process of forming a second $SiO_2$ film as a second protection film at an extremely low temperature by an ALD method using the substrate processing apparatus 101. Description will not be repeated for the same processing as that of the first protection film forming process in which the first $SiO_2$ film 604 is formed as a first protection film.

In the current embodiment, TDMAS is used as a Si source gas, gas such as $O_2$ activated by plasma excitation is used as an oxidizing source, and $N_2$ is used as a carrier gas, and this case will be explained with reference to FIG. 1, FIG. 2, and FIG. 6. In addition, by controlling the heater 207, the temperature of the wafer 200 is kept at a temperature lower than a deformation temperature of a resist film, for example, in the range from room temperature to 150° C., preferably 100° C.

(Step 21)

While introducing (flowing) TDMAS into the source gas supply pipe 300, $O_2$ into the source gas supply pipe 340, and $N_2$ into the carrier gas supply pipes 510, 520 and 530, the valves 304, 514, 524 and 534 are opened appropriately. However, the valves 314, 324, 334, and 344 are in a closed state.

Figure 6:
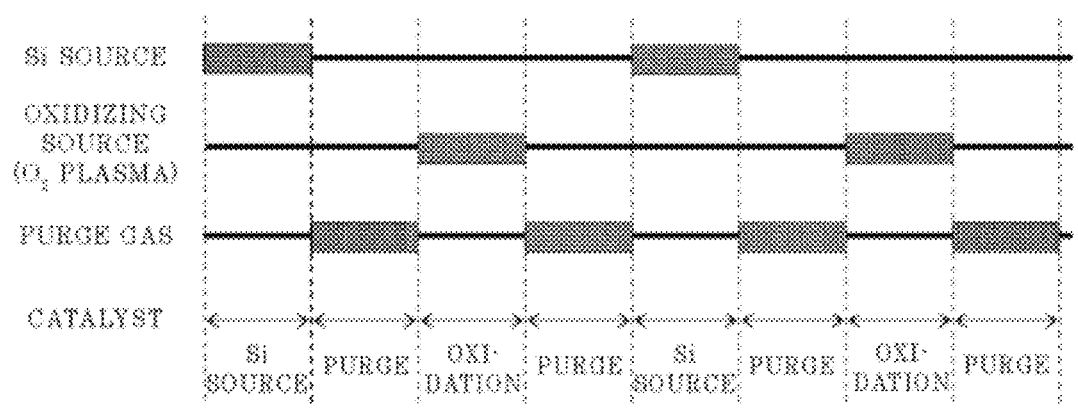
FIG. 6 is a schematic view illustrating a main gas supply sequence in the case where a $SiO_2$ film 605 is formed by an ALD method, in a preferred embodiment of the present invention.

As a result, as shown in FIG. 6, the TDMAS, while mixing with $N_2$, flows out through the source gas supply pipe 300 to the nozzle 400, and is supplied from the gas supply holes 400a into the processing chamber 201.

In addition, $N_2$ flows out through the carrier gas supply pipe 500 to the nozzle 400, and is supplied from the gas supply holes 400a into the processing chamber 201. The TDMAS supplied into the processing chamber 201 passes over the surface of the wafer 200 and is exhausted through the exhaust pipe 231.

In step 21, by controlling the valve 304, the supply time of the TDMAS is set to 1 second to 100 seconds, preferably, 2 seconds to 10 seconds. At the same time, by controlling the valve 243e properly, the inside pressure of the processing chamber 201 is kept at an optimal value (for example, 7 Ton) within a predetermined range. In step 21, by supplying the TDMAS into the processing chamber 201, Si or intermediate Si is adsorbed on the first $SiO_2$ film 604.

(Step 22)

By closing the valve 304, the supply of the TDMAS is stopped. At the same time, as shown in FIG. 6, by continuously supplying $N_2$ from the carrier gas supply pipes 510, 520 and 530 into the processing chamber 201, the inside of the processing chamber 201 is purged with $N_2$. The purge time is, for example, 15 seconds. At this time, two processes (purging and vacuum-evacuation processes) may be performed within 15 seconds. As a result, the TDMAS remaining in the processing chamber 201 is discharged from the processing chamber 201.

(Step 23)

In a state that the valves 514, 524 and 534 are opened, the valve 344 is opened appropriately. The valve 304, 314, 324, and 344 are in a closed state. As a result, as shown in FIG. 5, $O_2$, while mixing with $N_2$, flows out through the source gas supply pipe 340 to the nozzle 440, and is supplied from the gas supply holes 440a into the processing chamber 201. Then, high-frequency power is applied between the first and second rod-shaped electrodes 269 and 270 from the high-frequency power source 273 through the matching device 272, so as to plasma-excite the $O_2$ and supply the excited $O_2$ into the processing chamber 201 through the gas supply holes 44b as an activated species. The $O_2$ plasma supplied to the processing chamber 201 passes over the surface of the wafer 200 and is exhausted through the exhaust pipe 231.

In step 23, by controlling the valve 334, the supply time of the $O_2$ plasma is adjusted in the range from 1 second to 100 seconds, preferably, in the range from 2 seconds to 10 seconds. At the same time, by controlling the valve 243e properly, the inside pressure of the processing chamber 201 is set to an optimal value (for example, 0.5 Ton) within a predetermined range. In step 23, the $O_2$ plasma supplied into the processing chamber 201 reacts with Si or intermediate Si adsorbed on the first $SiO_2$ film 604 so that a $SiO_2$ film can be formed.

In step 23, as an oxidizing source (corresponding to $O_2$ plasma), $O_2$ plasma is exemplified; however, other sources such as $(O_2+H_2)$ plasma, $N_2O$ plasma, and No plasma may be used.

(Step 24)

By closing the valve 344, the supply of $O_2$ is stopped. At the same time, as shown in FIG. 6, by continuously supplying $N_2$ from the carrier gas supply pipes 510, 520 and 530 into the processing chamber 201, the inside of the processing chamber 201 is purged with $N_2$. The purge time is, for example, 15 seconds. At this time, two processes (purging and vacuum-evacuation processes) may be performed within 15 seconds. As a result, the $O_2$ plasma remaining inside the processing chamber 201 is discharged from the processing chamber 201.

Thereafter, steps 21 to 24 are set as one cycle, and this cycle is repeated a plurality of times to form a second $SiO_2$ film 605 having a predetermined thickness on the first $SiO_2$ film 604. In this case, in each of the cycles, as explained above, it should be noted that the Si source used in step 21 should not be mixed with the oxidizing source used in step 23. In this way, as a second protection film, the second $SiO_2$ film 605 is formed on the first $SiO_2$ film 604 formed as a first protection film (step D' in FIG. 4).

Thereafter, the TDMAS and $O_2$ plasma remaining in the processing chamber 201 are exhausted by vacuum-exhausting the inside of the processing chamber 201, and the inside of the processing chamber 201 is set to atmospheric pressure by controlling the valve 243e, and the boat 217 is unloaded from the processing chamber 201. In this way, a film forming process (batch process) is finished once.

As a thickness of a protection film, the total thickness of the first $SiO_2$ film 604 and the second $SiO_2$ film may be 50 Å or smaller, preferably, in the range from 10 Å to 30 Å. If the thickness of the first $SiO_2$ film is 10 Å or greater, the first resist pattern 603a can be sufficiently protected from damage by plasma. Therefore, the thickness of the second $SiO_2$ film may be in the range from 10 Å to 40 Å, preferably, from 10 Å to 20 Å.

Figure 7:
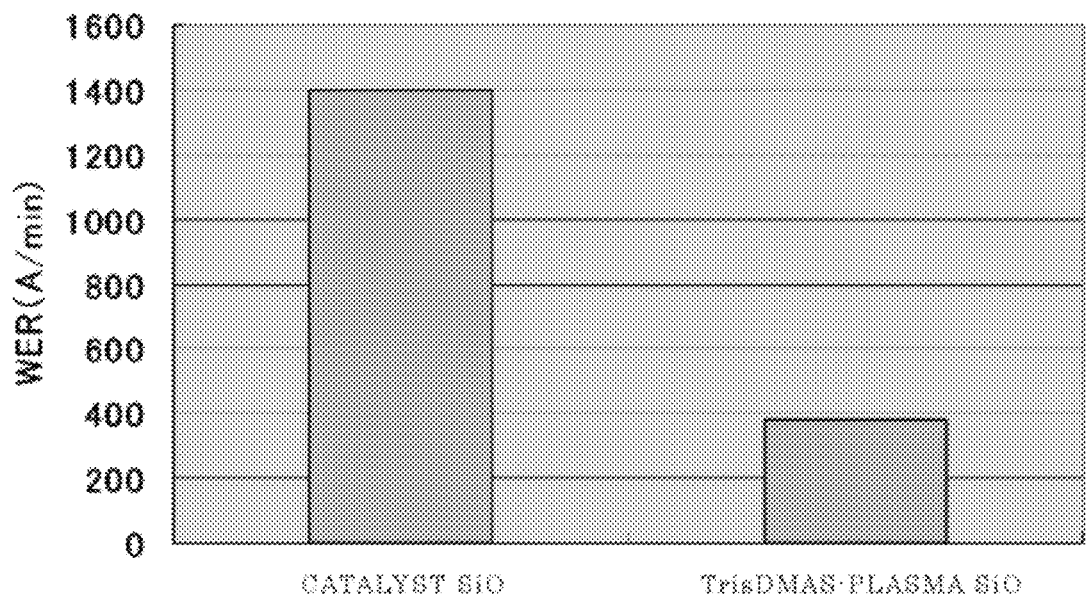
FIG. 7 is a view illustrating a wet etching property of a $SiO_2$ film for different silicon (Si) sources in a preferred embodiment of the present invention.

FIG. 7 is view showing a wet etching rate (WER) of a second $SiO_2$ film 605 formed using TDMAS and $O_2$ plasma in comparison with a WER of a first $SiO_2$ film 604 formed using HCD, $H_2O$, and a catalyst. WERs of the films for a hydrogen fluoride (HF) solution are shown. Generally, since the WER of a film increases as the moisture concentration of the film increases, it can be considered that the WER of a film reflects the moisture concentration of the film. As shown in FIG. 7, the WER of the first $SiO_2$ film 604 formed by using a catalyst is about 1400 Å/min, and the WER of the second $SiO_2$ film 605 formed by using plasma is relatively low at about 400 Å/min which is about ¼ the WER of the first $SiO_2$ film 604. That is, the moisture concentration of the second $SiO_2$ film is relatively low.

<Second Resist Pattern Forming Process>

In the second resist pattern forming process, the second resist pattern 603b is formed on the second $SiO_2$ film 605, which is formed in the first protection film forming process, at a position different from the position where the first resist pattern 603a is formed. That is, the second resist pattern 603b is formed between a plurality of parts of the first resist pattern 603a. At this time, the second resist pattern 603b may be formed with a predetermined gap such that the side surfaces of the second resist pattern 603b do not make contact with the second $SiO_2$ film 605 covering the first resist pattern 603a.

This process also proceeds in the same manner as the first resist pattern forming process.

First, a second resist solvent 602b is applied to the second $SiO_2$ film 605 which is a second protection film (step e in FIG. 4). Thereafter, the second resist pattern 603b is formed by baking, and exposure and development using a light source such as an ArF excimer light source (193 nm) or a KrF excimer light source (248 nm) (step G in FIG. 4).

As mentioned above, by performing the first resist pattern forming process, the first protection film forming process, the second protection film forming process, and the second resist pattern forming process, a fine resist pattern can be formed In addition, after the second resist pattern is formed, predetermined processing (for example, dimension inspection, correction inspection, and rework processing) is performed and, if necessary, as described below, a first protection film removing process may be performed for removing the first $SiO_2$ film 604 and the second $SiO_2$ film 605

<First Protection Film Removing Process>

In the first protection film removing process, the first $SiO_2$ film 604 and the second $SiO_2$ film 605 are removed.

Two removing methods, a wet etching method and a dry etching method, can be used. In the case of the first $SiO_2$ film

604 and the second $SiO_2$ film 605 are removed by the wet etching method, an etchant such as a dilute hydrogen fluoride (HF) solution may be used.

Although the above explanation has been given on a process of forming a resist pattern twice, a resist pattern may be formed three or more times and in this case, a resist pattern forming process and a resist protection film forming process may be repeated predetermined times.

In the case where a resist pattern is formed three or more times, if necessary, a protection film may be removed one by one in the following sequence: a first resist pattern forming process→a first protection film forming process→a second protection film forming process→a second resist pattern forming process→a first and second protection film removing process→a third resist pattern forming process→a third protection film forming process→a fourth protection film forming process→a fourth resist pattern forming process→a third and fourth protection film removing process→a fifth resist pattern forming process→ . . . .

A Si source such as trisdimethylaminosilane (TDMAS: $SiH(N(CH_3)_2)_3$), dichlorosilane ($SiH_2Cl_2$), hexachlorosilane ($Si_2Cl_6$), or tetrachlorosilane ($SiCl_4$) may be used; an oxidizing source such as $H_2O$ or $H_2O_2$ may be used; the Si source and the oxidizing source may alternately be supplied according to an ALD method; a catalyst may be used when the Si source and the oxidizing source are alternately supplied; and the alternate supply may be repeated a plurality of times so as to form a $SiO_2$ film to a desired thickness. In this way, the first $SiO_2$ film 604 may be formed at a low temperature as a first resist protection material.

Figure 8:
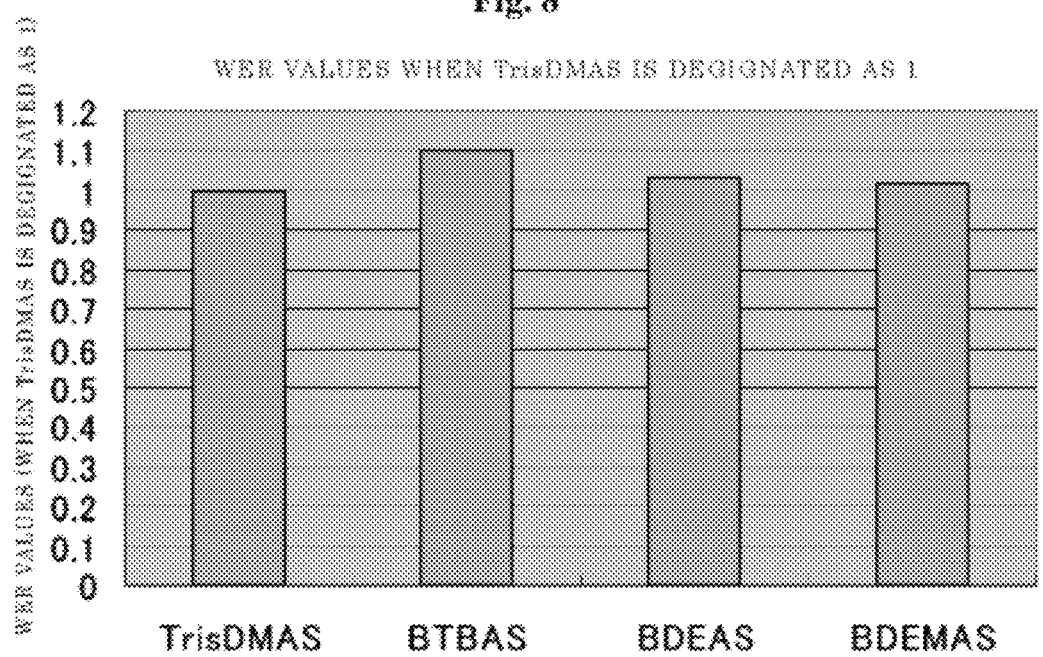
FIG. 8 is a view illustrating wet etching property of a $SiO_2$ film for different Si sources in a preferred embodiment of the present invention.
Figure 9:
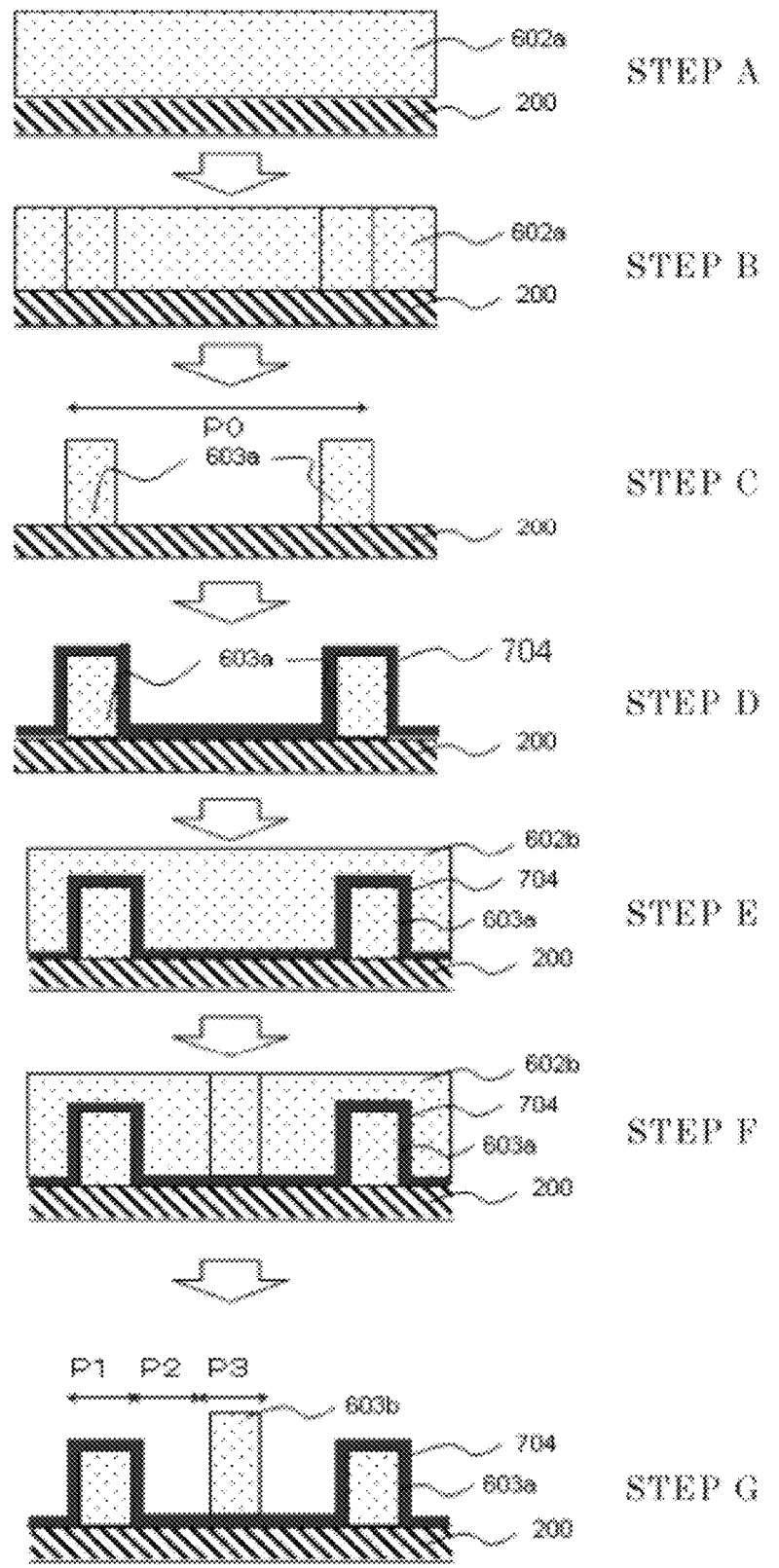
FIG. 9 is a schematic view illustrating formation of a protection film used in a convention double exposure method.
Figure 10:
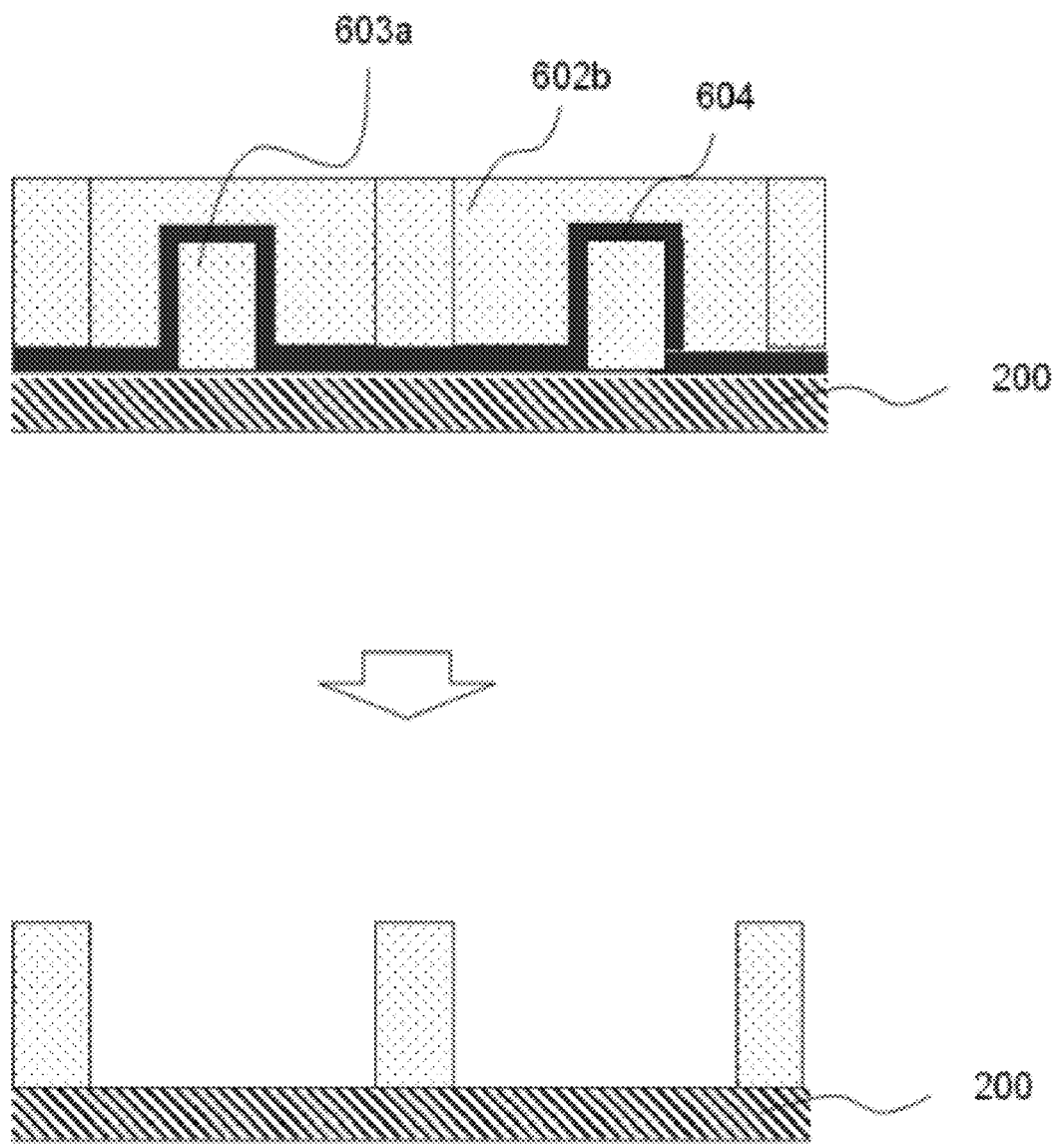
FIG. 10 is a view for explaining a problem of a protection film used in a conventional double exposure method.

In addition, a Si source such as trisdimethylaminosilane (TDMAS: $SiH(N(CH_3)_2)_3$), bis tertiary butyl amino silane (BTBAS), bis(diethylamino)silane (BDEAS), or bis(ethylmethylamino)silane (BDEMAS) may be used. FIG. 8 shows relative WERs of Si sources based on the WER of TDMAS which is normalized to 1. Referring to FIG. 8, WERs are not dependent on Si sources. Therefore, it can be understood that resistance to a developer is not dependent on Si sources. In addition, an oxidizing source such as $O_2$ plasma, ($O_2+H_2$) plasma, $N_2O$ plasma, or NO plasma may be used; a Si source and the oxidizing source may be alternately supplied according to an ALD method; and the alternate supply may be repeated a plurality of time to form a $SiO_2$ film to a desired thickness. In this way, the second $SiO_2$ film 605 may be formed at a low temperature as a second protection material.

Preferably, for compatibility with an oxidizing source, a different Si source may be used according to an oxidizing source. For example, as described above, if a catalyst and an oxidizing source are used, HCD may be used, and if $O_2$ plasma is used, TDMAS may be used. The reason for this is based on the experience of the inventors as follows.

When a catalyst and an oxidizing source are used, it is considered that the catalyst can easily act on Si—Cl bonds in a compound in the case of HCD, and thus Si—OH bonds can be easily formed. However, in the case of TDMAS, it is considered that the catalyst cannot easily act on Si—N bonds in a compound, and thus Si—OH bonds are not sufficiently formed. Therefore, the use of HCD is preferable.

When $O_2$ plasma is used, it is considered that $O_2$ plasma cannot easily act on Si—Cl bonds in a compound in the case of HCD, and thus Si—OH bonds cannot be easily formed. However, in the case of TDMAS, it is considered that since $O_2$ plasma can easily act on Si—N bonds in a compound, Si—OH bonds can be easily formed. Therefore, the use of TDMAS is preferable.

As mentioned above, by forming the thin film on the surface of the first resist pattern, the first resist pattern can be protected and, when the second resist solvent is applied, the second resist solvent can be prevented from penetrating into the first resist pattern.

Furthermore, as mentioned above, since the penetration of the second resist solvent into the first resist pattern is prevented, the second resist pattern can be formed in a region where the first resist pattern is not formed, and it is possible to form fine resist pattern with a minimum spacing of 50 nm or less between the first resist pattern and the second resist pattern.

Moreover, by forming the thin film on the surface of the first resist pattern, the mechanical strength of the first resist pattern can be improved in the second resist pattern forming process.

In addition, a thin film capable of undergoing a process at an extremely low temperature, such as an extremely low temperature $SiO_2$ film, can be used as a protection film. In this case, a thin film can be formed at a temperature lower than a resist deformation temperature in a protection film forming process to protect the first resist pattern without causing deformation of the first resist pattern.

In addition, the protection film is formed in two layers, and the second protection film that makes contact with a developer is formed by a plasma film forming method so that the second protection film can be highly resistant to the developer. Therefore, penetration of the developer into the protection film can be prevented to protect the first resist pattern. Since the first protection film under the second protection film is formed by a catalyst film forming method, the first resist pattern can be protected from plasma.

In the two-layer protection film, the second protection film that makes contact with the second resist pattern may be sufficient as long as the second protection film is resistant to a developer used for forming the second resist pattern although the second protection film causes thermal or plasma deformation or damage of a resist, and the first protection film that makes contact with the first resist pattern is formed in a manner such that the first protection film does not cause thermal or plasma deformation or damage of a resist so as to protect the first resist pattern.

According to the semiconductor device manufacturing method relevant to an embodiment of the present invention, a thin film that can be formed at a low temperature by using a catalyst or plasma is used as a protection film so as to form the thin film at a temperature lower than a resist deformation temperature, so that deformation of the first resist pattern can be prevented in a protection film forming process.

In a resist processing process, typically, errors such as misalignment with an under layer or dimension errors occur frequently and, in this case, a resist pattern is removed through an ashing process by using oxygen plasma or the like, and a rework process of resuming the resist pattern forming process from the beginning shall be carried out, but the rework process of the second resist pattern has a problem that the first resist pattern is damaged by oxygen plasma or the like. However, as mentioned above, by forming a thin film such as a $SiO_2$ film, which can endure a plasma ashing process, on the first resist pattern, the first resist pattern can be protected in the rework process of the second resist pattern.

Moreover, in forming the second resist pattern, it is required to detect alignment mark, which is formed on the wafer, for position alignment with the under pattern. Therefore, a thin film as the first protection film is required to be transparent.

In the above-described embodiments, an exemplary case of forming a $SiO_2$ film using plasma as a second protection film is described. Properties necessary for the second protection film are high resistance to a developer, that is, a low moisture concentration, and a transparent property. Therefore, the second protection film may be a $Si_3N_4$ film (silicon nitride film) formed by using a nitriding source. In addition, the moisture concentration of the second protection film is sufficiently lower than the moisture concentration of the first protection film.

In the case of forming a $Si_3N_4$ film as the second protection film, any one of the above-described catalyst film forming method and the plasma film forming method can be used so as not to use a moisture-containing source. In both cases, the same compound as that can be used for forming the $SiO_2$ film can be used as a Si-containing source. In addition, if the catalyst film forming method is used, the catalyst as that used for forming the $SiO_2$ can be used. As a nitriding source, nitrogen (N)-containing gas having NH bonds, such as $NH_3$, $Na_f$, $(CH_3)N_2H_3$, or $(CH_3)_2N_2H_2$ may be used.

According to a semiconductor device manufacturing method relevant to an embodiment of the present invention, a protection film is formed on a first resist pattern formed on a substrate, and a second resist pattern is formed on the protection film in a region where the first resist pattern is not formed, wherein the protection film is formed in at least two layers by using different methods. Therefore, the first resist pattern can be protected, and when a second resist solvent is applied, penetration of the second resist solvent into the first resist pattern can be prevented.

(Supplementary Note)

The present invention also includes the following preferred embodiments.

(Supplementary Note 1)

According to an embodiment of the present invention, there is provided a method of manufacturing a semiconductor device, the method comprising:

forming a protection film on a first resist pattern formed on a substrate; and forming a second resist pattern on the protection film between parts of the first resist pattern, wherein the protection film is formed in at least two layers by using different methods.

(Supplementary Note 2)

Preferably, the forming of the protection film may comprise:

forming a first protection film on the first resist pattern by using a catalyst; and forming a second protection film on the first protection film by using plasma.

(Supplementary Note 3)

Preferably, each of the first protection film and the second protection film may be formed by depositing a source gas.

(Supplementary Note 4)

The protection film may comprise a first protection film making contact with the first resist pattern and a second protection film making contact with the second resist pattern, and the second protection film may have a predetermined thickness and a developer resistance not to transmit a developer when the second resist pattern is formed.

(Supplementary Note 5)

The developer resistance of the second protection film may be greater than that of the first protection film.

(Supplementary Note 6)

The protection film may comprise a first protection film making contact with the first resist pattern and a second protection film making contact with the second resist pattern, and the second protection film may have a predetermined thickness and a low moisture concentration not to transmit a developer when the second resist pattern is formed.

(Supplementary Note 7)

The moisture concentration of the second protection film may be lower than that of the first protection film.

(Supplementary Note 8)

According to another embodiment of the present invention, there is provided a method of manufacturing a semiconductor device by forming a first resist pattern and a second resist pattern on a substrate by performing an exposure process twice, the method comprising: forming a first protection film on the first resist pattern; and forming a second protection film on the first protection film in contact with the second resist pattern.

(Supplementary Note 9)

The forming of the first protection film may comprise:

exposing the substrate accommodated in a processing chamber to a first source gas;

exposing the substrate accommodated in the processing chamber to a second source gas; and supplying a catalyst into the processing chamber, wherein the forming of the second protection film may comprise:

exposing the first protection film to a third source gas so that at least a component of the third source gas is adsorbed on the first protection film; and exposing the substrate to a fourth source gas activated by plasma excitation so that the fourth source gas reacts with the component of the third source gas adsorbed on the first protection film.

(Supplementary Note 10)

Preferably, the exposing of the substrate to the first source gas and the supplying of the catalyst may be simultaneously performed, and/or the exposing of the substrate to the second source gas and the supplying of the catalyst may be simultaneously performed.

(Supplementary Note 11)

Preferably, in the forming of the first protection film, the first source gas and the second source gas may be supplied in a manner such that the first source gas and the source gas are not mixed with each other, and in the forming of the second protection film, the third source gas and the fourth source gas may be supplied in a manner such that the third source gas and the fourth source gas are not mixed with each other.

(Supplementary Note 12)

Preferably, in the forming of the first protection film, the exposing of the substrate to the first source gas, the exposing of the substrate to the second source gas, and the supplying of the catalyst may be repeated a plurality of times so as to form the first protection film to a desired thickness; and in the forming of the second protection film, the exposing of the first protection film to the third source gas and the exposing of the substrate to the fourth source gas may be repeated a plurality of times so as to form the second protection film to a desired thickness.

(Supplementary Note 13)

Preferably, the forming of the first protection film and the forming of the second protection film may be performed in situ.

(Supplementary Note 14)

Preferably, the first source gas and the third source gas may be Si-containing gases.

(Supplementary Note 15)

Preferably, the first source gas may be one of trisdimethylaminosilane (TDMAS), dichlorosilane (DCS), hexachlorosilane (HCD), and tetrachlorosilane.

(Supplementary Note 16)

Preferably, the second source gas and the fourth source gas may be oxidizing sources.

(Supplementary Note 17)

Preferably, the second source gas may be one of $H_2O$ and $H_2O_2$.

(Supplementary Note 18)

Preferably, the fourth source gas may be one of $O_2+H_2$, $N_2O$, and NO.

(Supplementary Note 19)

Preferably, the catalyst may be one of pyridine, pyrimidine, quinoline, aminopyridine, picoline, piperazine, and lutidine.

(Supplementary Note 20)

Preferably, the third source gas may be one of trisdimethylaminosilane (TDMAS), bis tertiary butyl amino silane (BTBAS), bis(diethylamino)silane (BDEAS), and bis(ethylmethylamino)silane (BDEMAS).

(Supplementary Note 21)

Preferably, the forming of the first protection film and the forming of the second protection film may be performed by heating the substrate to 150° C. or lower.

(Supplementary Note 22)

Preferably, the forming of the first protection film and the forming of the second protection film may be performed by heating the substrate to about 100° C.

(Supplementary Note 23)

According to another embodiment of the present invention, there is provided a method of manufacturing a semiconductor device, the method comprising:

forming a protection film on a first resist pattern formed on a substrate; and forming a second resist pattern on the protection film in a region where the first resist pattern is not formed, wherein the protection film is formed in at least two layers by using different methods.

Furthermore, in the above-described embodiments, when a thin film is formed in the first protection film forming process, a vertical type substrate processing apparatus is exemplified; however, the present invention may be applied to other apparatuses such as a single wafer type substrate processing apparatus and a horizontal type substrate processing apparatus.

Furthermore, in the above-described embodiments, a substrate processing apparatus configured to form a thin film is described as an example of a semiconductor device manufacturing apparatus; however, as well as the substrate processing apparatus, the semiconductor device manufacturing apparatus may include a resist processing apparatus configured to form a resist pattern. In this case, a resist pattern and a thin film can be batch-processed.

What is claimed is:

1. A method of manufacturing a semiconductor device, the method comprising:
   (a) forming a first resist pattern on a substrate;
   (b) forming a protection film including a first protection film and a second protection film for protecting the first resist pattern by forming the first protection film covering the first resist pattern using a first method, and forming the second protection film on the first protection film using a second method different from the first method; and
   (c) forming a second resist pattern on a portion of the second protection film between first resist pattern.

2. The method of claim 1, wherein the first method includes using a catalyst and the second method includes using a plasma.

3. The method of claim 2, wherein each of the first protection film and the second protection film is formed by a deposition of a source gas.

4. The method of claim 1, wherein the first protection film is in contact with the first resist pattern, and the second protection film is in contact with the second resist pattern,
   the second protection film having a developer resistance so as to prevent a penetration of a developer during the step (c).

5. The method of claim 4, wherein the developer resistance of the second protection film is greater than that of the first protection film.

6. The method of claim 1, wherein the first protection film is in contact with the first resist pattern, and the second protection film is in contact with the second resist pattern,
   the second protection film having a low moisture concentration so as to prevent a penetration of a developer during a formation process of the second resist pattern.

7. The method of claim 6, wherein a moisture concentration of the second protection film is lower than that of the first protection film.

8. The method of claim 1, wherein the step (b) comprises:
   exposing the substrate accommodated in a processing chamber to a first source gas;
   exposing the substrate accommodated in the processing chamber to a second source gas;
   supplying a catalyst into the processing chamber;
   exposing the first protection film to a third source gas so that at least one component of the third source gas is adsorbed on the first protection film; and
   exposing the substrate to a fourth source gas activated by plasma excitation so that the fourth source gas reacts with the at least one component of the third source gas adsorbed on the first protection film.

9. The method of claim 8, wherein the step (b) is performed in-situ.

10. A method of manufacturing a semiconductor device by forming a first resist pattern and a second resist pattern on a substrate by performing an exposure process twice, the method comprising:
    forming a first protection film on the first resist pattern using a first method; and
    forming a second protection film on the first protection film in contact with the second resist pattern using a second method different from the first method.

11. A method of manufacturing a semiconductor device, the method comprising:
    forming a first protection film on a substrate having a resist pattern formed thereon; and
    forming a second protection film on the first protection film using a method different from that of the first protection film.

* * * * *